United States Patent
Dong et al.

(10) Patent No.: US 11,971,375 B2
(45) Date of Patent: Apr. 30, 2024

(54) METHOD FOR DETECTING ADSORPTION PERFORMANCE OF MICROPLASTICS FOR HEAVY METALS USING LOW-FIELD NMR RELAXATION METHOD

(71) Applicants: Yanhui Dong, Beijing (CN); Jingfan Ye, Beijing (CN)

(72) Inventors: Yanhui Dong, Beijing (CN); Jingfan Ye, Beijing (CN)

(*) Notice: Subject to any disclaimer, the term of this patent is extended or adjusted under 35 U.S.C. 154(b) by 0 days.

(21) Appl. No.: 18/490,723

(22) Filed: Oct. 19, 2023

(65) Prior Publication Data

US 2024/0085358 A1  Mar. 14, 2024

(51) Int. Cl.
  *G01N 24/08* (2006.01)
  *G01N 1/28* (2006.01)
  *G01N 1/38* (2006.01)

(52) U.S. Cl.
  CPC ... *G01N 24/084* (2013.01); *G01N 2001/2893* (2013.01); *G01N 2001/386* (2013.01)

(58) Field of Classification Search
  CPC ......... G01N 24/084; G01N 2001/2893; G01N 2001/386
  See application file for complete search history.

(56) References Cited

PUBLICATIONS

Chen et. al. "Speciation and release risk of heavy metals bonded on simulated naturally-aged microplastics prepared from artificially broken macroplastics", Environmental Pollution, 295, (2022) 118695. (Year: 2022).*
Lin et.al. "Comparative analysis of kinetics and mechanism for Pb(II) sorption onto three kinds of microplastics", Ecotoxicology and Environmental Safety 208 (2021) 111451. (Year: 2021).*
Liu et. al. "adsorption mechanism of trace heavy metals on microplastics and simulating their effect on microalgae in river", Environmental Research, 214 (2022) 113777. (Year: 2022).*
CNIPA Office Action, Application No. CN202310396186., dated May 25, 2023, pp. 1-3.
CNIPA Office Action, Application No. CN202310396186., dated May 25, 2023, (English Translation, machine translation prepared Oct. 18, 2023) pp. 1-7.

\* cited by examiner

*Primary Examiner* — G. M. A Hyder
(74) *Attorney, Agent, or Firm* — Addison D. Ault; Richard P. Moerschell; IPGentleman Intellectual Property Services, LLC

(57) ABSTRACT

A method for detecting adsorption performance of microplastics for heavy metals using low-field NMR relaxation method, including: establishing a reference line reflecting a relationship between a target heavy metal ion concentration and a transverse relaxation time; conducting a heavy metal adsorption experiment on microplastics and obtaining samples at different time points; detecting transverse relaxation times of the multiple samples obtained; determining a heavy metal ion concentration of each sample based on the reference line of the target heavy metal ion concentration and the transverse relaxation time; analyzing data and implementing a model fitting process. The method according to the present disclosure does not require cumbersome and complicated sample pre-processing, it can be measured immediately after sampling, it is simple, fast and low-cost, the method has a wide detection limit, the detection is faster, non-destructive testing can be achieved.

6 Claims, 7 Drawing Sheets

METHOD FOR DETECTING ADSORPTION PERFORMANCE OF MICROPLASTICS FOR HEAVY METALS USING LOW-FIELD NMR RELAXATION METHOD

CROSS-REFERENCE TO RELATED APPLICATION

This application claims the benefit of Chinese Patent Application No. CN202310396186.6 filed on Apr. 13, 2023 in China National Intellectual Property Administration, the whole disclosure of which is incorporated herein by reference.

TECHNICAL FIELD

The present disclosure relates to the field of water environment pollution detection or low-field nuclear magnetic resonance, and relates to a rapid and non-destructive detection method of heavy metals in aqueous solutions. Specifically, it relates to a method for detecting adsorption performance of microplastics for heavy metals using a low-field nuclear magnetic resonance (NMR) relaxation method, especially an analytical method of adsorption and desorption characteristics of microplastics for heavy metals in aqueous solutions using a low-field nuclear magnetic resonance (NMR) relaxation method.

In terms of technical classification, the present disclosure belongs to "testing or analyzing materials by measuring their chemical or physical properties", in particular, the subclass "using nuclear magnetic resonance" in "testing or analyzing materials by using nuclear magnetic resonance, electron paramagnetic resonance or other spin effects".

BACKGROUND

Microplastic pollution has been found all over the world, especially in water environments, and microplastics can be traced in oceans, lakes, rivers, and arctic glaciers. Microplastics can absorb various pollutants in the environment, especially in water bodies. When heavy metal pollution is serious, the adsorption and desorption of heavy metals by microplastics under different conditions may affect diffusion, transportation and circulation of heavy metal pollutants compounded by microplastics in the ecological environment. Typical heavy metals in the water environment include copper, chromium, iron, manganese, mercury, lead, etc. If water is contaminated by heavy metals, they can enter the human body and are not easily metabolized and excreted. Accumulation of heavy metals in the human body can lead to various diseases, especially, most heavy metals are toxic and carcinogenic, posing a threat to human health. Microplastics have been confirmed to be biologically toxic in the field of aquatic biological toxicology research and in animal cell experiments, posing a potential threat to health. Studying the migration, transportation and circulation of microplastics in the water environment after adsorbing heavy metals requires the study of the adsorption and desorption properties of microplastics for heavy metals under different conditions. Meanwhile, more advanced, fast and convenient technical means and detection methods are needed to detect the concentration of heavy metals absorbed by microplastics.

The main methods for detecting heavy metals in water environments include flow analysis detection, biochemical analysis, spectroscopy, chromatography, etc. At present, spectroscopic technology and mass spectrometry detection technology are mainly used to monitor changes in metal concentration indicators during the adsorption process of heavy metals by the microplastics, it includes atomic absorption spectrometry (AAS), inductively coupled plasma atomic emission spectrometry (ICP-OES), atomic fluorescence spectrometry (AFS), Ultraviolet—visible spectrophotometry (UV-Vis) and inductively coupled plasma mass spectrometry (ICP-MS), etc.

Traditional biochemical technology is time-consuming and complex to detect samples, especially during the experiment process of the adsorption of heavy metals by microplastics, the sample volume is large, the use of traditional biochemical technology is time-consuming, labor-intensive, and inefficient. Traditional optical detection requires complex and cumbersome pre-processing of samples, especially for microplastic adsorption detection, filters need to be used to filter microplastics, the detection limit is low, and samples of different concentrations need to be diluted, it takes a long time to implement the detection, most of the detections require sample consumption, making it impossible to carry out fast, in-situ, non-destructive, real-time monitoring. Meanwhile, due to the small size of microplastic particles, sometimes the filter cannot completely remove the microplastic particles from the sample. If using spectral analysis, the residual microplastic particles in the sample and the heavy metals absorbed therein may affect the detection results.

SUMMARY

The purpose of the present disclosure is to at least partially overcome the shortcomings of the prior art and provide a method for detecting adsorption performance of microplastics for heavy metals using low-field NMR relaxation method.

The present disclosure also aims to provide a method for detecting adsorption performance of microplastics for heavy metals using low-field NMR relaxation method, which is suitable for monitoring real-time changes of metal concentration during the adsorption of paramagnetic heavy metal ions by microplastics.

The present disclosure also aims to provide a method for detecting adsorption performance of microplastics for heavy metals using low-field NMR relaxation method, which can quantitatively monitor the adsorption process of heavy metals by microplastics in a quick, easy, cost-effective and non-destructive way.

The present disclosure also aims to provide a method for detecting adsorption performance of microplastics for heavy metals using low-field NMR relaxation method, which can overcome the shortcomings and defects of traditional spectral mass spectrometry in detecting changes of heavy metal concentration.

In order to achieve the above objectives or one of the objectives, the technical solutions of the present disclosure are as follows:

A method for detecting adsorption performance of microplastics for heavy metals using low-field NMR relaxation method, comprising:
  step S1: establishing a reference line reflecting a relationship between a target heavy metal ion concentration and a transverse relaxation time;
  step S2: conducting a heavy metal adsorption experiment on microplastics and obtaining samples at different time points;
  step S3: detecting transverse relaxation times of the multiple samples obtained;

step S4: determining a heavy metal ion concentration of each sample based on the reference line of the target heavy metal ion concentration and the transverse relaxation time;

step S5: analyzing data and implementing a model fitting process.

According to some embodiments of the present disclosure, the step S1 comprises:

step S11: preparing a standard solution of target heavy metal ions, using ultrapure water to dilute the standard solution into a plurality of secondary standard solutions with different concentrations, and putting the plurality of secondary standard solutions into different containers respectively;

step S12: using CPMG pulse sequence to measure transverse relaxation times of the secondary standard solutions with different concentrations, and calculating and obtaining a low-field NMR transverse relaxation rate, and then obtaining a linear relationship between the target heavy metal ion concentration and the low-field NMR transverse relaxation rate, where the low-field NMR transverse relaxation rate is $1/T_{2i}$-$1/T_{20}$, $T_{20}$ is a T2 value of the ultrapure water, T2 is a T2 value of heavy metal ions of the i-th secondary standard solution, and T2 is a transverse relaxation time;

step S13: obtaining the reference line of the target heavy metal ion concentration and the transverse relaxation time according to the linear relationship.

According to some embodiments of the present disclosure, the step S12 comprises:

after turning on a radio frequency switch of a low-field NMR instrument and before using the CPMG pulse sequence to measure the transverse relaxation times of the secondary standard solutions with different concentrations, using ultrapure water to implement inspection and calibration, and adjusting initial parameters.

According to some embodiments of the present disclosure, the step S2 comprises:

configuring a heavy metal solution with a predetermined concentration in an experimental container;

adding a predetermined mass of microplastic particles to the heavy metal solution, and using an ultrasonic machine to disperse the microplastic particles evenly, then putting the experimental container containing the heavy metal solution and the microplastic particles into a constant temperature water bath oscillator to allow the microplastic particles to absorb heavy metals;

taking samples from the experimental container at multiple predetermined time points, filtering the samples, and putting the obtained solutions into different chromatography bottles, to obtain samples at different time points, and then refrigerating the multiple samples to be tested.

According to some embodiments of the present disclosure, the step S3 comprises:

putting the multiple chromatography bottles containing the samples into test coils of a low-field NMR instrument respectively, turning on a radio frequency unit of the low-field NMR instrument, adjusting parameters, and using CPMG pulse sequence to measure transverse relaxation times of the samples sampled at different time points.

According to some embodiments of the present disclosure, in the step S3, for every 10 samples measured, an ultrapure water sample is measured for a calibration.

According to some embodiments of the present disclosure, in the step S5, based on the measured heavy metal ion concentration of the samples sampled at different time points, adsorption amounts $q_e$ of heavy metals per unit mass of microplastics at the different time points are calculated, and an adsorption kinetic curve is drawn; then, the adsorption kinetic curve obtained from the experiment is compared to a pseudo-first-order kinetic model and a pseudo-second-order kinetic model, to analyze characteristics of the adsorption behavior and the mechanism of adsorption.

According to some embodiments of the present disclosure, the adsorption amount $q_e$ is an equilibrium adsorption amount, and a calculation formula of the equilibrium adsorption amount is:

$$q_e = \frac{(C_i - C_e)}{M} \times V$$

where $C_i$ is an initial concentration of heavy metals in a water phase, in a unit of mg/L; $C_e$ is an equilibrium concentration of heavy metals in a water phase, in a unit of mg/L; M is a mass of microplastics, in a unit of g; V is a sample volume, in a unit of L.

According to some embodiments of the present disclosure, the step S1 further comprises: analyzing sensitivities of heavy metals with different concentrations to nuclear magnetic signals in low-field nuclear magnetic resonance, to obtain concentration detection sensitivities under different heavy metal concentration ranges;

in the step of "configuring a heavy metal solution with a predetermined concentration in an experimental container", the predetermined concentration is selected based on the concentration detection sensitivities under different heavy metal concentration ranges.

According to some embodiments of the present disclosure, the heavy metal ions are paramagnetic metal ions.

Compared with the prior art, the beneficial effects of the present disclosure include:

(1) The method for detecting adsorption performance of microplastics for heavy metals using low-field NMR relaxation method according to the embodiments of the present disclosure does not require cumbersome and complicated sample pre-processing, it can be measured immediately after sampling, it is simple, fast and low-cost.

(2) The method for detecting adsorption performance of microplastics for heavy metals using low-field NMR relaxation method according to the embodiments of the present disclosure has a wide detection limit and can implement sample concentration detection of ppb-ppm level. Compared with ICP-MS testing, there is no need to dilute the samples, the detection is faster, the use of CPMG pulse sequence to measure the T2 value allows the detection time to be less than 1 minute, which is much shorter than other detection methods.

(3) The required sample volume is small, and the test can be completed with 1-2 ml sample without losing the sample, thereby non-destructive testing can be achieved.

(4) The method for detecting adsorption performance of microplastics for heavy metals using low-field NMR relaxation method is particularly suitable for the detection of heavy metals adsorbed by microplastics, and has few interference items.

DETAILED DESCRIPTION OF EMBODIMENTS

Figure 1:
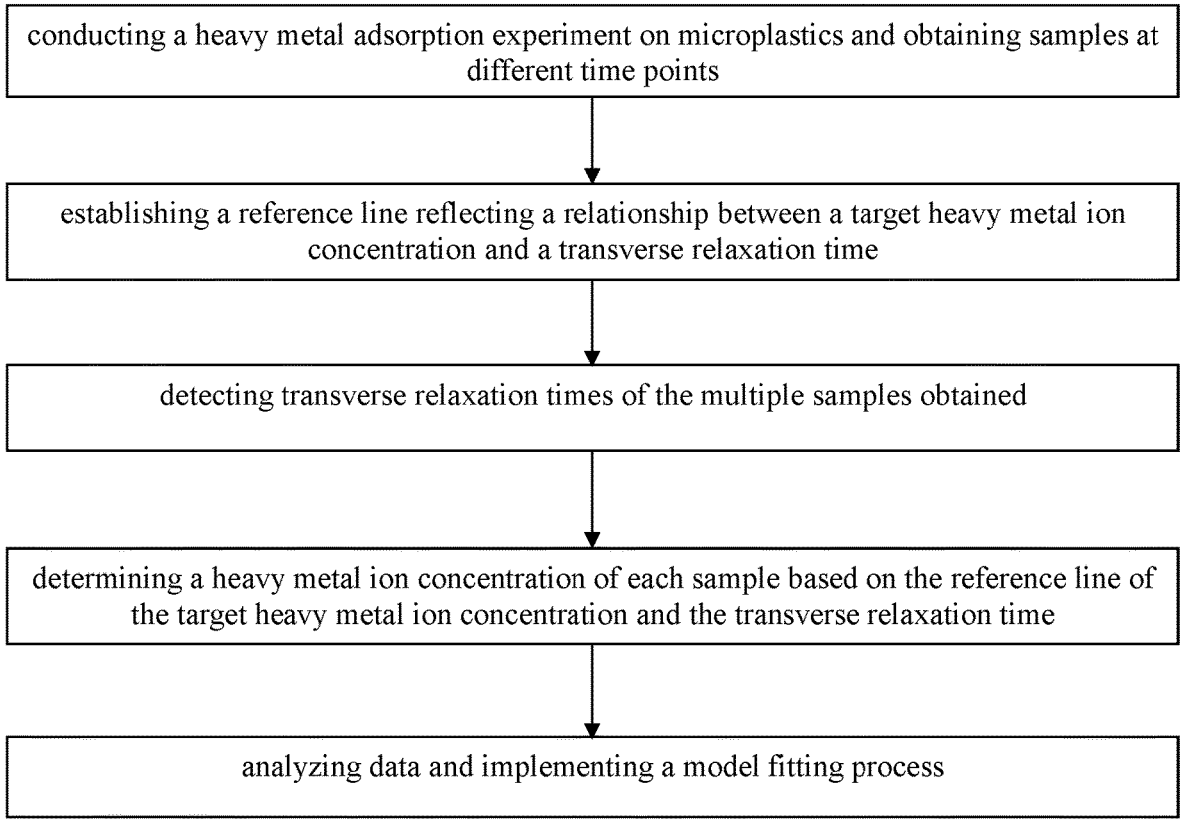
FIG. 1 is a flow chart of a method for detecting adsorption performance of microplastics for heavy metals using low-field NMR relaxation method according to an embodiment of the present disclosure.

Exemplary embodiments of the present disclosure will be described in detail below with reference to the accompanying drawings, in which the same or similar reference numerals represent same or similar elements. Further, in the following detailed description, for convenience of explanation, numerous specific details are set forth to provide a comprehensive understanding of the disclosed embodiments. However, it will be apparent that one or more embodiments may be carried out without these specific details. In other instances, well-known structures and devices are simplistically illustrated in order to simplify the drawings.

Low-field Nuclear Magnetic Resonance (NMR) is a non-destructive, accurate and quantitative detection method for detecting the distribution and content of hydrogen protons in substances. In terms of pollutant detection, it can achieve quantitative analysis of the concentration of hydrocarbon-containing, paramagnetic heavy metal ions, and can also monitor real-time dynamic changes of heavy metal ions in some media. The present disclosure is based on the low-field nuclear magnetic resonance relaxation method, uses the CPMG (Carr-Purcell-Meiboom-Gill) pulse sequence, and utilizes the linear relationship between the concentration of paramagnetic heavy metal ions and the low-field nuclear magnetic resonance transverse relaxation rate of hydrogen protons [$1/T_{2i}-1/T_{20}$] ($T_{20}$ is the T2 value of ultrapure water, T2 is the T2 value corresponding to different concentrations of heavy metal ions, T2 is the transverse relaxation time) to establish a reference line, and then take samples for detection during the adsorption process, and observe the change value of T2, convert it to metal concentration with reference to the reference line, and thereby achieve the purpose of quantitative analysis of adsorption of heavy metals by microplastics.

The method for detecting adsorption performance of microplastics for heavy metals using low-field NMR relaxation method according to the present disclosure is used to detect/analyze/research the adsorption performance of microplastics for heavy metals, obtain data such as the adsorption amount of heavy metals on microplastics at different times, and obtain an adsorption kinetic curve, etc., in order to study the migration, transportation and circulation of microplastics in the water environment after adsorbing heavy metals. The method mainly includes:

Step S1: establishing a reference line reflecting a relationship between a target heavy metal ion concentration and a transverse relaxation time.

The NMR signal is a current signal generated by cutting the coil when hydrogen protons in the porous medium relax. According to the principle of nuclear magnetic resonance, it can be known that the nuclear magnetic resonance signal is directly proportional to the content of the hydrogen protons contained in the measured sample. After the radio frequency field is applied, the process of the nucleus returning from a non-equilibrium high-energy state to an equilibrium low-energy state is called relaxation, and the time it takes is the relaxation time. The excited nucleus transfers energy to the equilibrium nucleus and returns itself to the equilibrium state. The time taken when the energy decays to 1/e of the maximum value is defined as T2, also known as the transverse relaxation time, where e is a natural constant.

First, prepare a standard solution of target heavy metal ions, use ultrapure water to dilute the standard solution into a plurality of secondary standard solutions with different concentrations, and put the plurality of secondary standard solutions into different containers respectively;

Secondly, use CPMG pulse sequence to measure transverse relaxation times of the secondary standard solutions with different concentrations, and calculate and obtain a low-field NMR transverse relaxation rate, and then obtain a linear relationship between the target heavy metal ion concentration and the low-field NMR transverse relaxation rate, where the low-field NMR transverse relaxation rate is $1/T_{2i}-1/T_{20}$, $T_{20}$ is a T2 value of the ultrapure water, $T_{2i}$ is a T2 value of heavy metal ions of the i-th secondary standard solution, and T2 is a transverse relaxation time;

Then, obtain the reference line of the target heavy metal ion concentration and the transverse relaxation time according to the linear relationship.

Low-field NMR is suitable for analyzing the concentration of paramagnetic metal ions. Therefore, the target heavy metal ions are set to paramagnetic metal ions. In the above steps, after turning on the radio frequency switch of a low-field nuclear magnetic resonance instrument and before using the CPMG pulse sequence to measure the transverse relaxation times of the secondary standard solutions with different concentrations, ultrapure water is used to implement inspection and calibration, and the initial parameters are adjusted.

Step S2: conducting a heavy metal adsorption experiment on microplastics and obtaining samples at different time points. It specifically includes:

configuring a heavy metal solution with a predetermined concentration in an experimental container;

adding a predetermined mass of microplastic particles to the heavy metal solution, and using an ultrasonic machine to disperse the microplastic particles evenly, then putting the experimental container containing the heavy metal solution and the microplastic particles into a constant temperature water bath oscillator to allow the microplastic particles to absorb heavy metals;

taking samples from the experimental container at multiple predetermined time points, filtering the samples, and putting the obtained solutions into different chromatography bottles, to obtain samples at different time points, and then refrigerating the multiple samples to be tested.

Herein, glass bottles are used as the experimental container. During the process of configuring the heavy metal solution with a predetermined concentration, the pH value and ionic strength of the solution can be artificially controlled. The samples obtained at different time points may be 1-2 ml.

Step S3: detecting transverse relaxation times of the multiple samples obtained.

Specifically, the step S3 includes: putting the multiple chromatography bottles containing the samples into test coils of a low-field NMR instrument respectively, turning on a radio frequency unit of the low-field NMR instrument, adjusting parameters, and using CPMG pulse sequence to measure transverse relaxation times of the samples sampled at different time points.

The CPMG pulse sequence is used, the CPMG pulse sequence uses an echo method, that is, after the 90° pulse is applied, a series of 180° complex phase pulses are added to obtain the T2 value of the sample in which the influence of uneven magnetic field is eliminated.

In the step S3, advantageously, for every 10 samples measured, an ultrapure water sample is measured for a calibration.

Step S4: determining a heavy metal ion concentration of each sample based on the reference line of the target heavy metal ion concentration and the transverse relaxation time.

Step S5: analyzing data and implementing a model fitting process.

After obtaining the transverse relaxation times T2 of the solution system, the concentration of heavy metals in the solution system can be calculated with reference to the reference line of the target heavy metal ion concentration and T2. Thus, we can obtain the changes in the concentration of heavy metal ions in the solution at different times after the adsorption occurs, so that the ability, behavioral characteristics, influencing factors and adsorption mechanisms of microplastics in the solution to adsorb heavy metals can be analyzed.

In the step S5, based on the measured heavy metal ion concentration of the samples sampled at different time points, adsorption amounts $q_e$ of heavy metals per unit mass of microplastics at the different time points are calculated, and an adsorption kinetic curve is drawn; then, the adsorption kinetic curve obtained from the experiment is compared to a pseudo-first-order kinetic model and a pseudo-second-order kinetic model, to analyze characteristics of the adsorption behavior and the mechanism of adsorption. Wherein, the adsorption amount $q_e$ is an equilibrium adsorption amount, and a calculation formula of the equilibrium adsorption amount is:

$$q_e = \frac{(C_i - C_e)}{M} \times V$$

where $C_i$ is an initial concentration of heavy metals in a water phase, in a unit of mg/L; $C_e$ is an equilibrium concentration of heavy metals in a water phase, in a unit of mg/L; M is a mass of microplastics, in a unit of g; V is a sample volume, in a unit of L.

According to some embodiments of the present disclosure, the step S1 further comprises: analyzing sensitivities of heavy metals with different concentrations to nuclear magnetic signals in low-field nuclear magnetic resonance, to obtain concentration detection sensitivities under different heavy metal concentration ranges;

in the step of "configuring a heavy metal solution with a predetermined concentration in an experimental container", the predetermined concentration is selected based on the concentration detection sensitivities under different heavy metal concentration ranges.

Next, take Cu(II) as an example to describe the experimental steps in detail:

First, prepare Cu(II) solutions with different concentrations, and use the CPMG pulse sequence to establish a reference line between Cu(II) concentration and T2 value (step S1).

Use a balance to weigh 0.1 g of analytical grade copper sulfate crystals and add it to a flask with a total volume of 500 ml, use a graduated cylinder to get 100 ml of ultrapure water and add it to the flask to prepare a $CuSO_4$ solution with a concentration of 1000 ppm. Use a pipette to transfer 1 ml, 2 ml, 4 ml, 6 ml, and 8 ml of the prepared solutions into five glass bottles with a volume of 10 ml, then use a pipette to add 9 ml, 8 ml, 6 ml, 4 ml, and 2 ml of ultrapure water respectively, dilute them 10, 5, 2.5, 1.6, and 1.25 times to obtain secondary standard solutions with concentrations of 100, 200, 400, 600, and 800 ppm.

Figure 2:
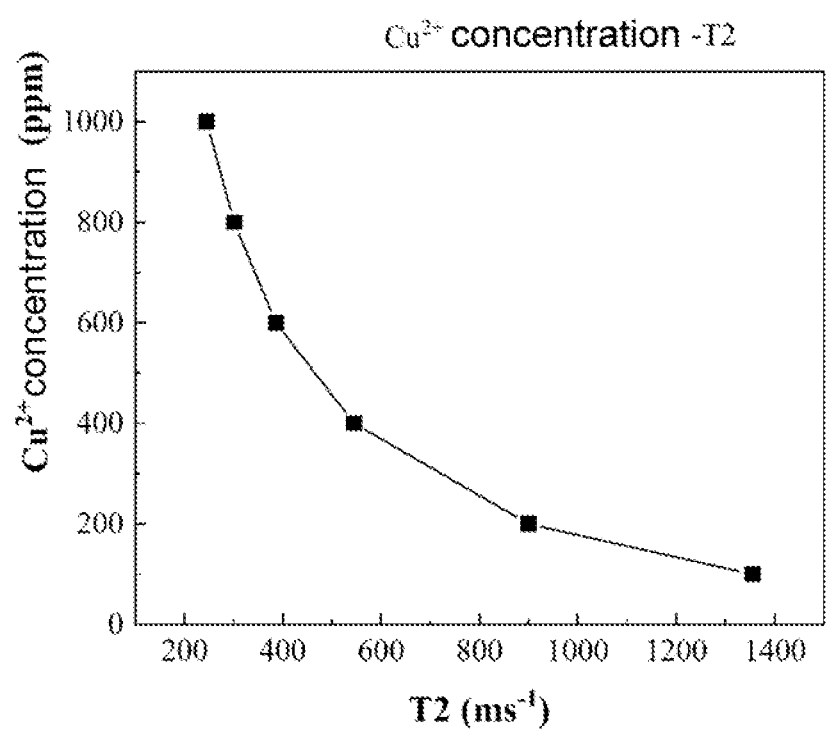
FIG. 2 shows the relationship between heavy metal ion concentration and transverse relaxation time.
Figure 3:
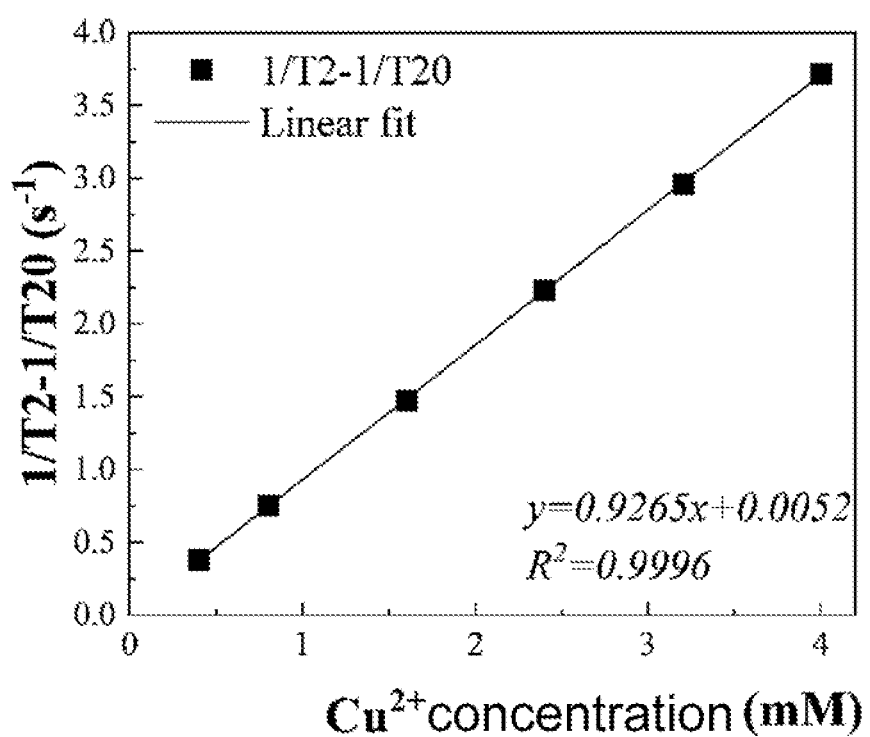
FIG. 3 shows a linear relationship between heavy metal ion concentration and transverse relaxation rate.

Turn on the radio frequency switch of a low-field NMR instrument, use oil samples to adjust the main frequency and sampling frequency, adjust the initial parameters, and perform ultrapure water inspection and calibration when using it for the first time (the T2 value of ultrapure water≈2800). Use the CPMG pulse sequence to measure the T2 values of the secondary standard solutions of Cu(II) with concentrations of 100, 200, 400, 600, and 800 ppm, as shown in FIG. 2. The low-field NMR transverse relaxation rate is calculated ($1/T_{2i}$-$1/T_{20}$, where $T_{20}$ is the T2 value of ultrapure water, T1 is the T2 value of heavy metal ions of the i-th secondary standard solution, and T2 is the transverse relaxation time), a linear relationship between the heavy metal ion concentration and the transverse relaxation rate is established, as shown in FIG. 3. It can be seen that the fitting data is good, $R^2$ is 0.9996. Then, according to the linear relationship, a reference line reflecting the relationship between the target heavy metal ion concentration and the transverse relaxation time is obtained.

Then, perform an adsorption experiment and obtain a sample (step S2).

Use ultrapure water to prepare experimental samples in glass bottles with a volume of 30 ml. Use a pipette to add 24 ml of ultrapure water to the glass bottle, and then add 6 ml of 1000 ppm copper sulfate standard solution to obtain 30 ml of Cu(II) metal solution with a concentration of 200 ppm. Use a balance to weigh 0.9 g of PS (polystyrene) microplastic particles with a particle size of 1.5 μm, and add them to the prepared solution. Use an ultrasonic machine to evenly disperse the microplastics in the solution system, put them into a constant temperature water bath oscillator, and implement absorption at 25° C. and 50 rpm. At five moments of 0.1, 2, 4.67, 6.67, and 48 hours, use disposable syringes to withdraw 2 ml of the sample, pass the samples through a syringe filter with a pore size of 0.22 μm, and respectively inject them into chromatography bottles with a volume of 2 ml, refrigerate the multiple samples to be tested.

Then, measure the T2 values of the sample solutions (step S3).

Put the chromatography bottles containing the samples into the test coils of the low-field NMR instrument, the diameter of the test coils is 25 mm. Turn on the RF unit of the low-field NMR instrument and adjust the parameters. The adjustment steps are the same as before. Use the CPMG pulse sequence to measure the T2 values of samples sampled at different times, and during the measurement process, for every 10 samples measured, a sample of ultrapure water is measured for a calibration or correction (T2 value of ultrapure water≈2800).

Then, calculate the heavy metal concentrations of the sample solutions (step S4).

When the T2 values of the samples sampled at different times have been obtained, compare with the corresponding concentration curves of heavy metal ions, input them into the linear equation of Cu (II) concentration and T2 value to obtain the heavy metal concentrations of the samples sampled at different times.

Then, analyze data and implement a model fitting process (step S5).

Based on the measured heavy metal concentration data at different times, the adsorption amount $q_e$ (mg/g) of heavy metals per unit mass of microplastics at each time can be calculated, then the adsorption kinetic curve can be drawn. By fitting the adsorption kinetic curve obtained experimentally with the pseudo-first-order kinetic model and the pseudo-second-order kinetic model, the characteristics of the adsorption behavior and the mechanism of adsorption can be analyzed.

In the present disclosure, the model of the low-field nuclear magnetic resonance instrument used in the experiment is MesoMR23-060H-I (Suzhou Niumag), and the model of the dual-function constant temperature water bath oscillator used is SHA-B (Bona Technology, Hangzhou Jingfei Instrument Technology Co., Ltd). The specific implementation parameters of the CPMG pulse sequence used in the previous steps are: main frequency (MHz) is 21, 90-degree pulse width (μs) is 6.00, sampling frequency (kHZ) is 100, waiting time (TW, ms) is 10000, echo time (TE, ms) is 1.5, the number of echoes (NECH) is 18000, and the number of accumulations (NS) is 4.

It should be noted that the nuclear magnetic system is sensitive to changes in ambient temperature. In order to reduce measure errors caused by temperature, laboratory temperature control should be done well.

Figure 4:
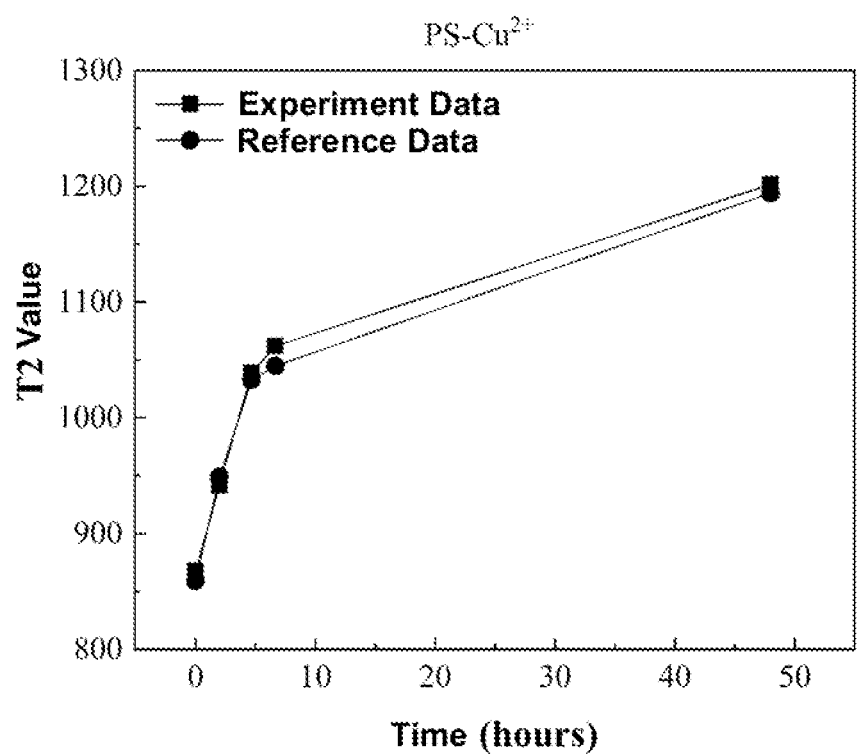
FIG. 4 shows transverse relaxation times of the samples sampled at different time points.

According to the method for detecting adsorption performance of microplastics for heavy metals using low-field NMR relaxation method in the above embodiments, the following results were obtained:

In the step S3, a change curve of T2 values of the samples sampled at different times VS. time is obtained, as shown in FIG. 4, it can be observed that the T2 value in the solution system continues to increase with time during the adsorption of heavy metals by microplastics.

Figure 5:
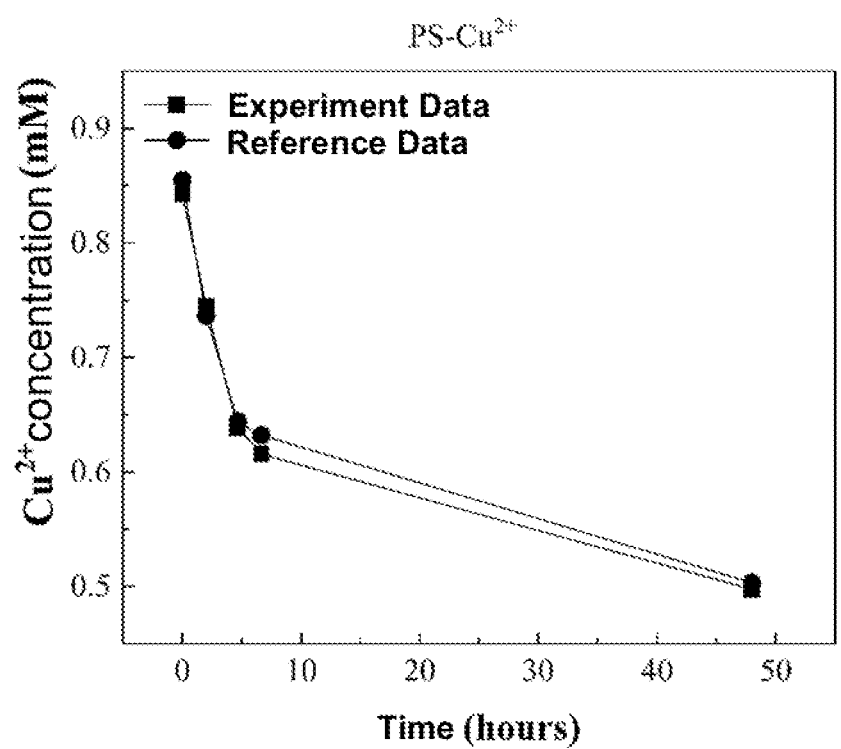
FIG. 5 shows a change curve of heavy metal ion concentration with time.

In the step S4, the T2 value is converted into the concentration of heavy metal ions, and the changes in the concentration of heavy metals in the solution system during the adsorption process are obtained. As shown in FIG. 5, it can be seen that the concentration of heavy metal ions continues to decrease with time during the adsorption process.

In the process of analyzing the results in step S5, the equilibrium adsorption amount $q_e$ (mg/g) can be calculated. The calculation formula is as follows:

$$q_e = \frac{(C_i - C_e)}{M} \times V$$

Where $q_e$ (mg/g) refers to the equilibrium adsorption amount of heavy metals on microplastics; $C_i$ (mg/L) refers to the initial concentration of heavy metals in the water phase; $C_e$ (mg/L) refers to the equilibrium concentration of heavy metals in the water phase; M (g) refers to the mass of microplastics; V (L) refers to the volume of the sample.

Figure 6:
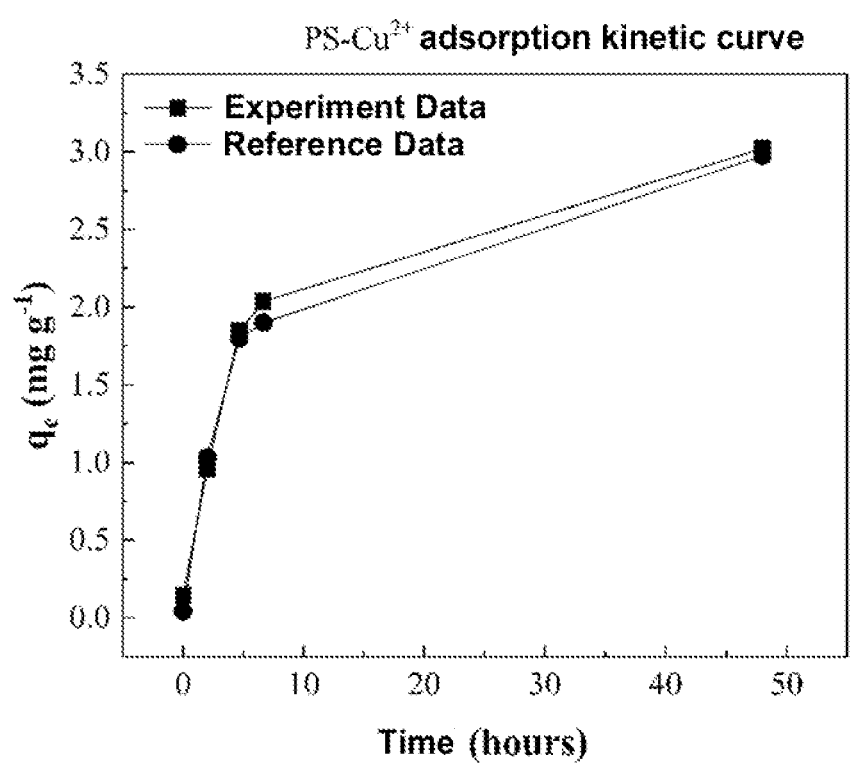
FIG. 6 shows a adsorption kinetic curve of heavy metals by microplastics.

Based on this, the adsorption kinetic curve of the heavy metal on microplastics can be obtained, as shown in FIG. 6.

In addition, through the step S1 of the method of the present disclosure, it can obtain the sensitivities of nuclear magnetic signals of different concentrations of heavy metals in the nuclear magnetic system, and obtain a heavy metal concentration range with high concentration detection accuracy, which provides a basis for concentration setting when designing adsorption experiments. It can be seen from FIG. 2 that if the Cu(II) concentration is less than 600 ppm, the concentration changes within a certain range cause a wider range of T2 value changes, that is, the use of nuclear magnetic detection has higher sensitivity in this concentration range.

Figure 7:
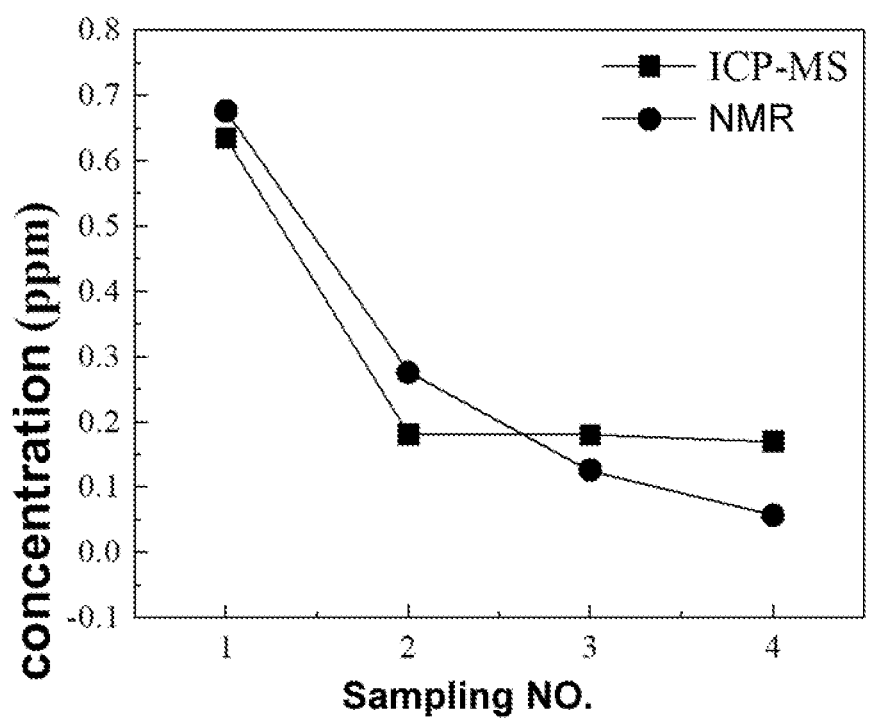
FIG. 7 is a comparison chart of the concentrations of Cr (III) detected during the adsorption process of microplastics by using the method of the present disclosure and by using ICP-MS.

The present disclosure also compares the use of a low-field nuclear magnetic resonance instrument to detect Cr(III) concentration during the adsorption process of microplastics with the use of ICP-MS, thereby we obtain FIG. 7. It is found that the trend of the data measured using the method of the present disclosure is similar with that of ICP-MS detection, and the initial detection value is closer to the prepared known concentration, with higher accuracy.

Compared with the prior art, the beneficial effects of the present disclosure include:
(1) The method for detecting adsorption performance of microplastics for heavy metals using low-field NMR relaxation method according to the embodiments of the present disclosure does not require cumbersome and complicated sample pre-processing, it can be measured immediately after sampling, it is simple, fast and low-cost.
(2) The method for detecting adsorption performance of microplastics for heavy metals using low-field NMR relaxation method according to the embodiments of the present disclosure has a wide detection limit and can implement sample concentration detection of ppb-ppm level. Compared with ICP-MS testing, there is no need to dilute the samples, the detection is faster, the use of CPMG pulse sequence to measure the T2 value allows the detection time to be less than 1 minute, which is much shorter than other detection methods.
(3) The required sample volume is small, and the test can be completed with 1-2 ml sample without losing the sample, thereby non-destructive testing can be achieved.
(4) The method for detecting adsorption performance of microplastics for heavy metals using low-field NMR relaxation method is particularly suitable for the detection of heavy metals adsorbed by microplastics, and has few interference items.

Although the embodiments of the present disclosure have been shown and described, it would be understood by those of ordinary skill in the art that changes may be made to these embodiments without departing from the principles and spirit of the present disclosure. The scope of application of the present disclosure is defined by the appended claims and their equivalents.

What is claimed is:
1. A method for detecting adsorption performance of microplastics for heavy metals using low-field NMR relaxation method, comprising:
step S1: establishing a reference line reflecting a relationship between a target heavy metal ion concentration and a transverse relaxation time;
step S2: conducting a heavy metal adsorption experiment on microplastics and obtaining samples at different time points;
step S3: detecting transverse relaxation times of the multiple samples obtained;

step S4: determining a heavy metal ion concentration of each sample based on the reference line of the target heavy metal ion concentration and the transverse relaxation time;

step S5: analyzing data and implementing a model fitting process, wherein the step S1 comprises:

step S11: preparing a standard solution of target heavy metal ions, using ultrapure water to dilute the standard solution into a plurality of secondary standard solutions with different concentrations, and putting the plurality of secondary standard solutions into different containers respectively;

step S12: using CPMG pulse sequence to measure transverse relaxation times of the secondary standard solutions with different concentrations, and calculating and obtaining a low-field NMR transverse relaxation rate, and then obtaining a linear relationship between the target heavy metal ion concentration and the low-field NMR transverse relaxation rate, where the low-field NMR transverse relaxation rate is $1/T_{2i} - 1/T_{20}$, $T_{20}$ is a T2 value of the ultrapure water, $T_{2i}$ is a T2 value of heavy metal ions of the i-th secondary standard solution, and T2 is a transverse relaxation time;

step S13: obtaining the reference line of the target heavy metal ion concentration and the transverse relaxation time according to the linear relationship, wherein the step S2 comprises:

configuring a heavy metal solution with a predetermined concentration in an experimental container;

adding a predetermined mass of microplastic particles to the heavy metal solution, and using an ultrasonic machine to disperse the microplastic particles evenly, then putting the experimental container containing the heavy metal solution and the microplastic particles into a constant temperature water bath oscillator to allow the microplastic particles to absorb heavy metals;

taking samples from the experimental container at multiple predetermined time points, filtering the samples, and putting the obtained solutions into different chromatography bottles, to obtain samples at different time points, and then refrigerating the multiple samples to be tested, wherein, in the step S5, based on the measured heavy metal ion concentration of the samples sampled at different time points, adsorption amounts $q_e$ of heavy metals per unit mass of microplastics at the different time points are calculated, and an adsorption kinetic curve is drawn; then, the adsorption kinetic curve obtained from the experiment is compared to a pseudo-first-order kinetic model and a pseudo-second-order kinetic model, to analyze characteristics of the adsorption behavior and the mechanism of adsorption, wherein the heavy metal ions are paramagnetic metal ions.

2. The method according to claim 1, wherein the step S12 comprises:

after turning on a radio frequency switch of a low-field NMR instrument and before using the CPMG pulse sequence to measure the transverse relaxation times of the secondary standard solutions with different concentrations, using ultrapure water to implement inspection and calibration, and adjusting initial parameters.

3. The method according to claim 1, wherein the step S3 comprises:

putting the multiple chromatography bottles containing the samples into test coils of a low-field NMR instrument respectively, turning on a radio frequency unit of the low-field NMR instrument, adjusting parameters, and using CPMG pulse sequence to measure transverse relaxation times of the samples sampled at different time points.

4. The method according to claim 3, wherein:

in the step S3, for every 10 samples measured, an ultrapure water sample is measured for a calibration.

5. The method according to claim 3, wherein the adsorption amount $q_e$ is an equilibrium adsorption amount, and a calculation formula of the equilibrium adsorption amount is:

$$q_e = \frac{(C_i - C_e)}{M} \times V$$

where $C_i$ is an initial concentration of heavy metals in a water phase, in a unit of mg/L; $C_e$ is an equilibrium concentration of heavy metals in a water phase, in a unit of mg/L; M is a mass of microplastics, in a unit of g; V is a sample volume, in a unit of L.

6. The method according to claim 1, wherein:

the step S1 further comprises: analyzing sensitivities of heavy metals with different concentrations to nuclear magnetic signals in low-field nuclear magnetic resonance, to obtain concentration detection sensitivities under different heavy metal concentration ranges;

in the step of "configuring a heavy metal solution with a predetermined concentration in an experimental container", the predetermined concentration is selected based on the concentration detection sensitivities under different heavy metal concentration ranges.

* * * * *

UNITED STATES PATENT AND TRADEMARK OFFICE
CERTIFICATE OF CORRECTION

PATENT NO. : 11,971,375 B2  
APPLICATION NO. : 18/490723  
DATED : April 30, 2024  
INVENTOR(S) : Yanhui Dong and Jingfan Ye Page 1 of 1

It is certified that error appears in the above-identified patent and that said Letters Patent is hereby corrected as shown below:

On the Title Page

Item (71), should be corrected to read:
Applicant: Institute of Geology and Geophysics, Chinese Academy of Sciences
19 Beitucheng West Road, Chaoyang District, Beijing, 100029, China Item (30), Foreign priority should read:
CN202311437517.2;October 30, 2023;

Signed and Sealed this  
Third Day of September, 2024

Katherine Kelly Vidal  
*Director of the United States Patent and Trademark Office*